(12) United States Patent
Park et al.

(10) Patent No.: US 12,713,825 B2
(45) Date of Patent: Aug. 18, 2026

(54) ORGANIC LIGHT-EMITTING DISPLAY APPARATUS HAVING OPTIMIZED LUMINANCE BY CONTROLLING THICKNESS VARIATION OF EMISSION LAYER

(71) Applicant: Samsung Display Co., Ltd., Yongin-si (KR)

(72) Inventors: Hyunsuk Park, Yongin-si (KR); Katsushi Kishimoto, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 693 days.

(21) Appl. No.: 17/839,384

(22) Filed: Jun. 13, 2022

(65) Prior Publication Data

US 2023/0403919 A1 Dec. 14, 2023

(30) Foreign Application Priority Data

Jun. 14, 2021 (KR) ........................ 10-2021-0076999

(51) Int. Cl.

| | |
|---|---|
| ***H10K 71/13*** | (2023.01) |
| ***B82Y 30/00*** | (2011.01) |
| ***H10K 30/82*** | (2023.01) |
| ***H10K 50/13*** | (2023.01) |
| ***H10K 102/00*** | (2023.01) |

(52) U.S. Cl.
CPC ............ *H10K 71/135* (2023.02); *B82Y 30/00* (2013.01); *H10K 30/82* (2023.02); *H10K 50/13* (2023.02); *H10K 2102/351* (2023.02)

(58) Field of Classification Search
CPC ...... H10K 71/135; H10K 50/13; H10K 30/82; H10K 2102/351; B82Y 30/00
USPC ........................................................... 257/40
See application file for complete search history.

(56) References Cited

U.S. PATENT DOCUMENTS

| | | | | |
|---|---|---|---|---|
| 9,000,426 | B2 | 4/2015 | Takii | |
| 9,922,595 | B2 | 3/2018 | Hirai et al. | |
| 10,141,384 | B2 | 11/2018 | Takata | |
| 2005/0029930 | A1* | 2/2005 | Yamazaki | H10K 59/80521 313/506 |
| 2008/0122347 | A1* | 5/2008 | Lee | H10K 59/80521 445/24 |
| 2009/0206733 | A1* | 8/2009 | Hwang | H10K 50/854 445/24 |
| 2011/0297943 | A1 | 12/2011 | Kim et al. | |
| 2013/0139720 | A1 | 6/2013 | Kawanami et al. | |
| 2018/0233548 | A1* | 8/2018 | Takata | G09G 3/3208 |

(Continued)

FOREIGN PATENT DOCUMENTS

| | | |
|---|---|---|
| JP | 2013-207206 | 10/2013 |
| JP | 2017-515276 | 6/2017 |
| JP | 2018-133144 | 8/2018 |

(Continued)

*Primary Examiner* — Norman D Richards
*Assistant Examiner* — Colin Russell McCutcheon
(74) *Attorney, Agent, or Firm* — Lerner David LLP

(57) ABSTRACT

An organic light-emitting display apparatus capable of a high-quality image including a substrate, a first pixel electrode over the substrate, and a first color emission layer disposed over the first pixel electrode and has an upper surface on which a distance in a direction perpendicular to a surface of the substrate between a highest point and a lowest point is about 400 Å to about 900 Å.

10 Claims, 5 Drawing Sheets

(56) References Cited

U.S. PATENT DOCUMENTS

2020/0006443 A1 * 1/2020 Park .................... H10K 59/352

FOREIGN PATENT DOCUMENTS

| | | | |
|---|---|---|---|
| JP | 2019102299 | A | 6/2019 |
| KR | 20080047725 | A | 5/2008 |
| KR | 10-2011-0132816 | | 12/2011 |
| KR | 20140068743 | A | 6/2014 |
| KR | 10-2014-0127382 | | 11/2014 |

* cited by examiner

ORGANIC LIGHT-EMITTING DISPLAY APPARATUS HAVING OPTIMIZED LUMINANCE BY CONTROLLING THICKNESS VARIATION OF EMISSION LAYER

CROSS-REFERENCE TO RELATED APPLICATION

This application claims priority from and the benefit of Korean Patent Application No. 10-2021-0076999, filed on Jun. 14, 2021, which is hereby incorporated by reference for all purposes as if fully set forth herein.

BACKGROUND

Field

Embodiments of the invention relate generally to organic light-emitting display apparatuses and methods of manufacturing the organic light-emitting display apparatuses, and more particularly, to an organic light-emitting display apparatus capable of displaying a high-quality image, and a method of manufacturing the organic light-emitting display apparatus.

Discussion of the Background

Organic light-emitting display apparatuses include an organic light-emitting device as a display device. Organic light-emitting devices include a pixel electrode, an opposite electrode, and an intermediate layer that includes an emission layer and is positioned between the pixel electrode and the opposite electrode. Organic light-emitting display apparatuses include an electronic device and/or a wiring for controlling an electrical signal applied to the organic light-emitting device.

In some organic light-emitting display apparatuses, a ratio of a luminance in a pixel that emits light of a certain color to a luminance in a pixel that emits light of another color may be different from a preset ratio.

The above information disclosed in this Background section is only for understanding of the background of the inventive concepts, and, therefore, it may contain information that does not constitute prior art.

SUMMARY

Embodiments of the invention provide an organic light-emitting display apparatus capable of displaying relatively high-quality images, and a method of manufacturing the organic light-emitting display apparatus.

Additional features of the invention will be set forth in part in the description which follows and, in part, will be apparent from the description, or may be learned by practice of the invention.

An embodiment of the invention provides an organic light-emitting display apparatus including a substrate, a first pixel electrode over the substrate, and a first color emission layer disposed over the first pixel electrode and having an upper surface on which a distance in a direction perpendicular to a surface of the substrate between a highest point and a lowest point is about 400 Å to about 900 Å.

A wavelength of light emitted by the first color emission layer may belong to a wavelength band of about 450 nm to about 495 nm.

The organic light-emitting display apparatus may further include a second pixel electrode disposed over the substrate to be apart from the first pixel electrode, and a second color emission layer disposed over the second pixel electrode and having an upper surface on which a distance in the direction perpendicular to the surface of the substrate between a highest point and a lowest point is about 400 Å to about 1,500 Å.

A wavelength of light emitted by the second color emission layer may belong to a wavelength band of about 495 nm to about 570 nm.

The organic light-emitting display apparatus may further include a third pixel electrode disposed over the substrate to be apart from the first pixel electrode and the second pixel electrode, and a third color emission layer disposed over the third pixel electrode and having an upper surface on which a distance in the direction perpendicular to the surface of the substrate between a highest point and a lowest point is about 400 Å to about 1500 Å.

A wavelength of light emitted by the third color emission layer may belong to a wavelength band of about 630 nm to about 750 nm.

The organic light-emitting display apparatus may further include a pixel defining layer covering an edge of the second pixel electrode. A thickness of the second color emission layer is smallest at a center of a portion of the second pixel electrode exposed by the pixel defining layer.

The second color emission layer may cover an inner side surface of the pixel defining layer in a direction to the center of the portion of the second pixel electrode exposed by the pixel defining layer.

The organic light-emitting display apparatus may further include a pixel defining layer covering an edge of the first pixel electrode. The first color emission layer has a portion having a thickness less than a thickness of a portion of the first color emission layer at a center of a portion of the first pixel electrode exposed by the pixel defining layer.

The portion of the first color emission layer having the thickness less than the thickness of the portion of the first color emission layer at the center of the portion of the first pixel electrode exposed by the pixel defining layer may surround the portion of the first color emission layer at the center of the portion of the first pixel electrode exposed by the pixel defining layer.

The first color emission layer may cover an inner side surface of the pixel defining layer in a direction to the center of the portion of the first pixel electrode exposed by the pixel defining layer.

A distance from the substrate to an end of the edge of the first color emission layer may be greater than a distance from the substrate to the portion of the first color emission layer at the center of the portion of the first pixel electrode exposed by the pixel defining layer.

Another embodiment of the invention provides a method of manufacturing an organic light-emitting display apparatus including forming a first pixel electrode over a substrate, and forming, by dropping a material for a first color emission layer over the first pixel electrode via inkjet printing, the first color emission layer having an upper surface on which a distance in a direction perpendicular to a surface of the substrate between a highest point and a lowest point is about 400 Å to about 900 Å.

A wavelength of light emitted by the first color emission layer may belong to a wavelength band of about 450 nm to about 495 nm.

The method may further include forming a pixel defining layer covering an edge of the first pixel electrode. The first color emission layer has a portion having a thickness less than a thickness of a portion of the first color emission layer at a center of a portion of the first pixel electrode exposed by the pixel defining layer.

The forming of the first pixel electrode may include forming the first pixel electrode and a second pixel electrode apart from each other over the substrate, and the method may further include forming, by dropping a material for a second color emission layer over the second pixel electrode via inkjet printing, the second color emission layer having an upper surface in which a distance in the direction perpendicular to the surface of the substrate between a highest point and a lowest point is about 400 Å to about 1,500 Å.

A wavelength of light emitted by the second color emission layer may belong to a wavelength band of about 495 nm to about 570 nm.

The method may further include forming a pixel defining layer covering an edge of each of the first pixel electrode and the second pixel electrode, and a thickness of the second color emission layer may be smallest at a center of a portion of the second pixel electrode exposed by the pixel defining layer.

The forming of the first pixel electrode may include forming the first pixel electrode, the second pixel electrode, and a third pixel electrode apart from each other over the substrate, and the method may further include forming, by dropping a material for a third color emission layer over the third pixel electrode via inkjet printing, the third color emission layer having an upper surface in which a distance in the direction perpendicular to the surface of the substrate between a highest point and a lowest point is about 400 Å to about 1,500 Å.

A wavelength of light emitted by the third color emission layer may belong to a wavelength band of about 630 nm to about 750 nm.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
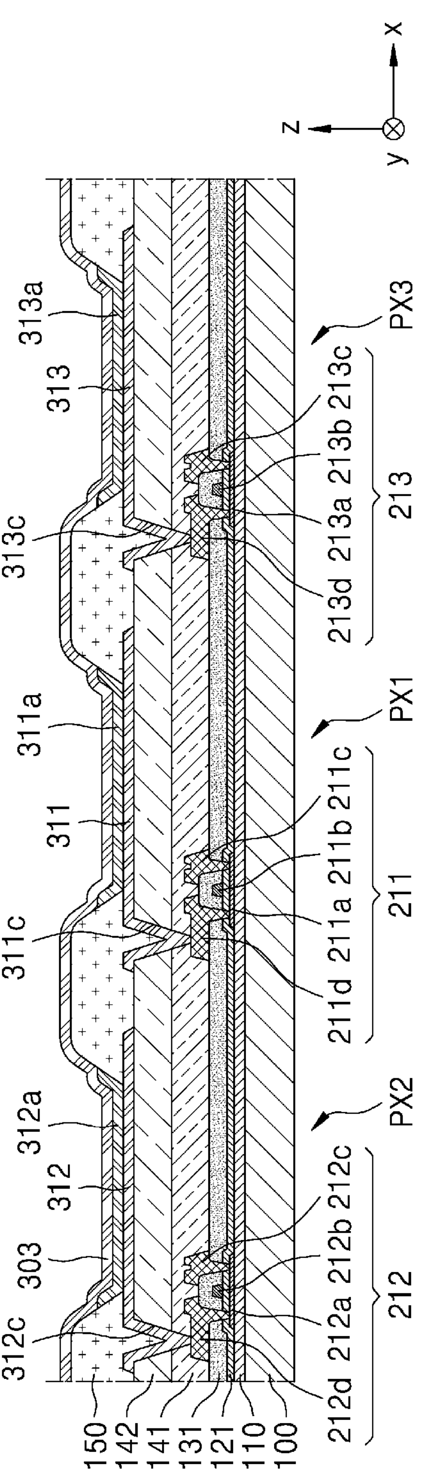
FIG. 1 is a schematic cross-sectional view of a portion of a display apparatus according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic cross-sectional view of a portion of a display apparatus according to an embodiment. FIG. 1 illustrates a portion of each of three pixels of an organic light-emitting display apparatus for convenience of description. Components of thin-film transistors may not be located in the same zx plane, unlike in FIG. 1. For example, a second gate electrode 212*b*, a second source electrode 212*c*, and a second drain electrode 212*d* of a second thin-film transistor 212 may not all be located in the same zx plane. Various modifications may be made to the arrangement shown in FIG. 1. For example, in one zx plane, only the second gate electrode 212*b* and the second source electrode 212*c* may be located, and the second drain electrode 212*d* may not be seen.

The three pixels may not be located in the same zx plane. Various modifications may be made to the arrangement shown in FIG. 1. For example, in one zx plane, only a first pixel PX1 and a second pixel PX2 may be located, and a third pixel PX3 may not be visible.

In the display apparatus according to the present embodiment, a plurality of pixels are located in a display area as shown in FIG. 1. A peripheral area located outside the display area includes a pad area to which various electronic devices or printed circuit boards are electrically attached. This may be understood as a substrate 100 having the display area and the peripheral area.

The substrate 100 may include glass, a metal, or a polymer resin. When the substrate 100 is flexible or bendable, the substrate 100 may include a polymer resin, such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may have a multi-layered structure including two layers each including a polymer resin and a barrier layer including an inorganic material (silicon oxide, silicon nitride, silicon oxynitride, or the like) and located between the two layers. In this way, various modifications may be made.

Organic light-emitting devices are arranged over the substrate 100. In addition to the organic light-emitting devices, first, second, and third thin-film transistors 211, 212, and 213 to which the organic light-emitting devices are electrically connected may be arranged over the substrate 100. The organic light-emitting devices being electrically connected to the first, second, and third thin-film transistors 211, 212, and 213 may be understood as first, second, and third pixel electrodes 311, 312, and 313 being electrically connected to the first, second, and third thin film transistors 211, 212, and 213.

For reference, in FIG. 1, the first thin-film transistor 211 is located in the first pixel PX1, the second thin-film transistor 212 is located in the second pixel PX2, and the third thin-film transistor 213 is located in the third pixel PX3. Accordingly, it is shown that the first pixel electrode 311 located in the first pixel PX1 is electrically connected to the first thin-film transistor 211, the second pixel electrode 312 located in the second pixel PX2 is electrically connected to the second thin-film transistor 212, and the third pixel electrode 313 located in the third pixel PX3 is electrically connected to the third thin-film transistor 213.

For convenience of description, the first thin-film transistor 211 will now be described, and the description may also apply to the second thin-film transistor 212 and the third thin-film transistor 213. In other words, some repetitive description of components of the second thin-film transistor 212 and the third thin-film transistor 213 may be omitted.

The first thin-film transistor 211 may include a first semiconductor layer 211*a* including amorphous silicon, polycrystalline silicon, or an organic semiconductor material, a first gate electrode 211*b*, a first source electrode 211*c*, and a first drain electrode 211*d*. The first gate electrode 211*b* may include any of various conductive materials and may have any of various layered structures. For example, the first gate electrode 211*b* may include a molybdenum (Mo) layer and an aluminum (Al) layer. The first source electrode 211*c* and the first drain electrode 211*d* may include any of various conductive materials and may have any of various layered structures. For example, each of the first source electrode 211*c* and the first drain electrode 211*d* may include a titanium (Ti) layer/Al layer/Ti layer.

To secure insulation between the first semiconductor layer 211*a* and the first gate electrode 211*b*, a gate insulating layer 121 may be between the first semiconductor layer 211*a* and the first gate electrode 211*b*. The gate insulating layer 121 may include an inorganic material, such as silicon oxide, silicon nitride, and/or silicon oxynitride. An interlayer insulating layer 131 may be disposed over the first gate electrode 211*b* and may include an inorganic material, such as silicon oxide, silicon nitride, and/or silicon oxynitride, and the first source electrode 211*c* and the first drain electrode 211*d* may be disposed over the interlayer insulating layer 131. An insulating layer including such an inorganic material may be formed via chemical vapor deposition (CVD) or atomic layer deposition (ALD). This is equally applied to embodiments to be described later and modifications thereof.

A buffer layer 110 may be between the first thin-film transistor 211 having this structure and the substrate 100 and may include one or more layers from among a silicon nitride layer, a silicon oxynitride layer, a silicon oxide layer, a titanium oxide layer, and an aluminum oxide layer. The buffer layer 110 may increase smoothness of an upper surface of the substrate 100 or prevent or minimize infiltration of impurities from the substrate 100 and the like into the first semiconductor layer 211*a* of the first thin-film transistor 211.

A first planarization layer 141 may be disposed over the first thin-film transistor 211. For example, when an organic light-emitting device is located over the first thin-film transistor 211 as illustrated in FIG. 1, the first planarization layer 141 may substantially planarize an upper portion of a protection layer that covers the first thin-film transistor 211. The first planarization layer 141 may include an organic material, such as acrylic resin, epoxy resin, phenolic resin, polyamide resin, polyimide resin, benzocyclobutene (BCB), or hexamethyldisiloxane (HMDSO).

When necessary, as shown in FIG. 1, a second planarization layer 142 may be disposed over the first planarization layer 141. In this case, a component or wiring, such as an electrode of a thin-film transistor, may be located between the first planarization layer 141 and the second planarization layer 142. The second planarization layer 142 may include an organic material, such as acrylic resin, epoxy resin, phenolic resin, polyamide resin, polyimide resin, benzocyclobutene (BCB), or hexamethyldisiloxane (HMDSO).

A description of the first semiconductor layer 211*a*, the first gate electrode 211*b*, the first source electrode 211*c*, and the first drain electrode 211*d* of the first thin-film transistor 211 applies to a second semiconductor layer 212*a*, the second gate electrode 212*b*, the second source electrode 212*c*, and the second drain electrode 212*d* of the second thin-film transistor 212 and a third semiconductor layer 213*a*, a third gate electrode 213*b*, a third source electrode 213*c*, and a third drain electrode 213*d* of the third thin-film transistor 213.

In the display area of the substrate 100, the first pixel electrode 311, the second pixel electrode 312, and the third pixel electrode 313 are disposed over the second planarization layer 142. As shown in FIG. 1, the first pixel electrode 311 disposed over the second planarization layer 142 contacts one of the first source electrode 211*c* and the first drain electrode 211*d* via a contact hole 311*c* formed in the first planarization layer 141 and the second planarization layer 142 to be electrically connected to the first thin-film transistor 211. Likewise, the second pixel electrode 312 disposed over the second planarization layer 142 contacts one of the second source electrode 212*c* and the second drain electrode 212*d* via a contact hole 312*c* formed in the first planarization layer 141 and the second planarization layer 142 to be electrically connected to the second thin-film transistor 212. Likewise, the third pixel electrode 313 disposed over the second planarization layer 142 contacts any one of the third source electrode 213*c* and the third drain electrode 213*d* through a contact hole 313*c* formed in the first planarization layer 141 and the second planarization layer 142 to be electrically connected to the third thin-film transistor 213.

When the display apparatus is a top emission type display apparatus that emits light to the outside through an opposite electrode 303, each of the first pixel electrode 311, the second pixel electrode 312, and the third pixel electrode 313 may be formed of a material having a high reflectance by having a stacked structure (Ti/Al/Ti) including aluminum and titanium, a stacked structure (ITO/Al/ITO) including aluminum and ITO, a stacked structure (ITO/Ag/ITO) including silver and ITO, an APC alloy, or a stacked structure (ITO/APC/ITO) including an APC alloy and ITO. The APC alloy is an alloy of silver (Ag), palladium (Pd), and/or copper (Cu).

When the display apparatus is a bottom emission type display apparatus that emits light to the outside through the first pixel electrode 311, the second pixel electrode 312, and the third pixel electrode 313, each of the first pixel electrode 311, the second pixel electrode 312, and the third pixel electrode 313 may include a transparent metal material (transparent conductive material (TCO)) capable of transmitting light such as ITO or IZO, or may include a semi-transmissive metal material (semi-transmissive conductive material) such as magnesium (Mg), silver (Ag), or an alloy of magnesium (Mg) and silver (Ag).

A pixel defining layer 150 may be disposed over the second planarization layer 142. The pixel defining layer 150 has an opening corresponding to each pixel to define a pixel. In other words, the pixel defining layer 150 may expose a central upper surface of the first pixel electrode 311, a central upper surface of the second pixel electrode 312, and a central upper surface of the third pixel electrode 313 by covering an edge of the first pixel electrode 311, an edge of the second pixel electrode 312, and an edge of the third pixel electrode 313.

The pixel defining layer 150 prevents an arc or the like from occurring at the edge of the pixel electrode 311 by increasing a distance between the edge of the pixel electrode 311 and the opposite electrode 303 disposed over the pixel electrode 311. The pixel defining layer 150 may include an organic material such as acrylic resin, epoxy resin, phenolic resin, polyamide resin, polyimide resin, or hexamethyldisiloxane (HMDSO).

A first color intermediate layer 311*a* including a first color emission layer is disposed over the first pixel electrode 311, a second color intermediate layer 312*a* including a second color emission layer is disposed over the second pixel electrode 312, and a third color intermediate layer 313*a* including a third color emission layer is disposed over the third pixel electrode 313. The first color intermediate layer

311*a* may generate light having a wavelength belonging to a first wavelength band, the second color intermediate layer 312*a* may generate light having a wavelength belonging to a second wavelength band, and the third color intermediate layer 313*a* may generate light having a wavelength belonging to a third wavelength band. The first wavelength band may range from about 450 nm to about 495 nm, the second wavelength band may range from about 495 nm to about 570 nm, and the third wavelength band may range from about 630 nm to about 750 nm. The first color intermediate layer 311*a*, the second color intermediate layer 312*a*, and the third color intermediate layer 313*a* may be formed by inkjet printing.

Not only the first color emission layer, the second color emission layer, and the third color emission layer are disposed over the first pixel electrode 311, the second pixel electrode 312, and the third pixel electrode 313. For example, a hole injection layer (HIL) or a hole transport layer (HTL) may be located between the first pixel electrode 311, the second pixel electrode 312, and the third pixel electrode 313 and the first color emission layer, the second color emission layer, and the third color emission layer, and an electron transport layer (ETL) or an electron injection layer (EIL) may be located between the first color emission layer, the second color emission layer, and the third color emission layer and the opposite electrode 303.

The electron transport layer and/or the electron injection layer may be integrated layers on the first pixel electrode 311, the second pixel electrode 312, and the third pixel electrode 313, or when necessary, the electron transport layer and/or the electron injection layer may be layers patterned to respectively correspond to the first pixel electrode 311, the second pixel electrode 312, and the third pixel electrode 313. Because the first color emission layer, the second color emission layer, and the third color emission layer are formed by inkjet printing, the hole injection layer and the hole transport layer may also be formed by inkjet printing before the first color emission layer, the second color emission layer, and the third color emission layer are formed. The electron transport layer and/or the electron injection layer may be formed by deposition, screen printing, laser-induced thermal imaging, or inkjet printing.

The opposite electrode 303 is disposed over the first color intermediate layer 311*a*, the second color intermediate layer 312*a*, and the third color intermediate layer 313*a*. The opposite electrode 303 may cover the display area. In other words, the opposite electrode 303 may be integrally formed to cover a plurality of organic light-emitting devices and thus may correspond to the first pixel electrode 311, the second pixel electrode 312, and the third pixel electrode 313.

The opposite electrode 303 covers the display area and extends to the peripheral area outside the display area. Accordingly, the opposite electrode 303 is electrically connected to an electrode power supply line located in the peripheral area. When the display apparatus is a top emission type display apparatus, the opposite electrode 303 may include a transparent metal material (transparent conductive material (TCO)) capable of transmitting light such as ITO or IZO, or may include a semi-transmissive metal material (semi-transmissive conductive material) such as magnesium (Mg), silver (Ag), or an alloy of magnesium (Mg) and silver (Ag). When the display apparatus is a bottom emission type display apparatus, the opposite electrode 303 may include a metal material having a high reflectance by having a stacked structure (Ti/Al/Ti) including aluminum and titanium, a stacked structure (ITO/Al/ITO) including aluminum and ITO, an APC alloy, or a stacked structure (ITO/APC/ITO) including an APC alloy and ITO. The APC alloy is an alloy of silver (Ag), palladium (Pd), and/or copper (Cu).

Because organic light-emitting devices may be easily damaged by external moisture, oxygen, or the like, an encapsulation layer (not shown) may cover and protect these organic light-emitting devices. The encapsulation layer may cover the display area, and may extend to at least a part of the peripheral area. For example, the encapsulation layer may include a first inorganic encapsulation layer, an organic encapsulation layer, and a second inorganic encapsulation layer.

Each of the first inorganic encapsulation layer and the second inorganic encapsulation layer may include silicon nitride, silicon oxynitride, silicon oxide, titanium oxide, or aluminum oxide. The organic encapsulation layer may include acrylic resin, epoxy resin, phenolic resin, polyamide resin, or polyimide resin.

As described above, the first color emission layer, the second color emission layer, and the third color emission layer are formed by inkjet printing. That is, the first color emission layer, the second color emission layer, and the third color emission layer are formed by locating an inkjet head on an upper surface of the first pixel electrode 311 exposed by the pixel defining layer 150 and dropping a first color emission layer forming material by inkjet printing, locating an inkjet head on an upper surface of the second pixel electrode 312 exposed by the pixel defining layer 150 and dropping a second color emission layer forming material by inkjet printing, and locating an inkjet head on an upper surface of the third pixel electrode 313 exposed by the pixel defining layer 150 and dropping a third color emission layer forming material by inkjet printing. The first color emission layer is formed by drying and/or curing the first color emission layer forming material dropped on the first pixel electrode 311, the second color emission layer is formed by drying and/or curing the second color emission layer forming material dropped on the second pixel electrode 312, and the third color emission layer is formed by drying and/or curing the third color emission layer forming material dropped on the third pixel electrode 313.

In FIG. 1, an upper surface (+z direction) of the first pixel electrode 311 is flat. However, in actuality, the upper surface of the first pixel electrode 311 is not flat. Because the first pixel electrode 311 is not formed to have a uniform thickness, the upper surface of the first pixel electrode 311 may not be flat. Alternatively, because various wires are located under the first pixel electrode 311 even when the first pixel electrode 311 is formed to have a uniform thickness, the first pixel electrode 311 may be curved and, thus, the upper surface thereof may not be flat. The first color emission layer disposed over the first pixel electrode 311 may also have a non-flat upper surface. Accordingly, there may be a plurality of peak points and a plurality of valley points on the upper surface of the first color emission layer.

Figure 2:
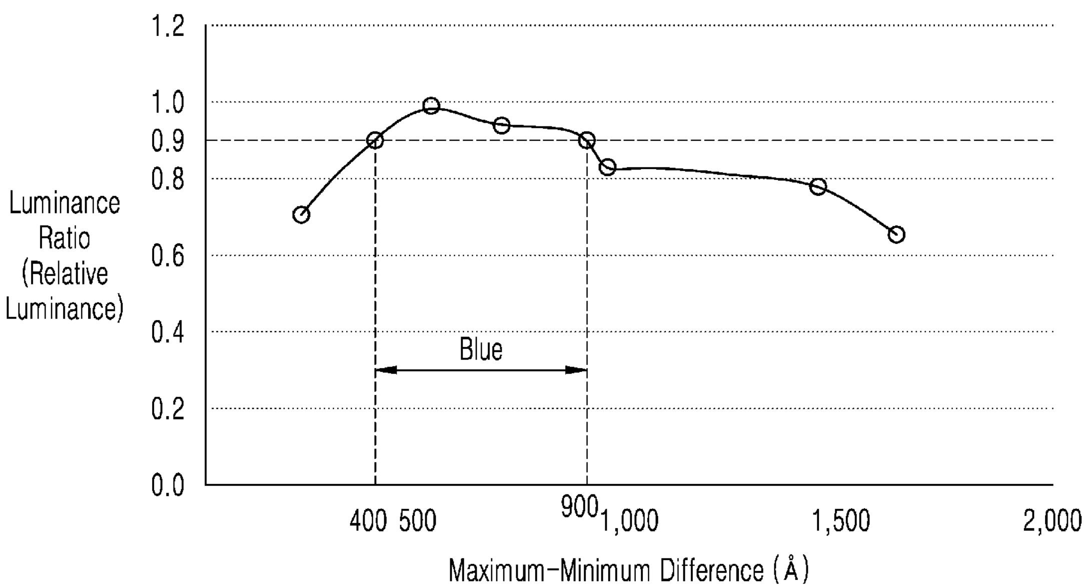
FIG. 2 is a graph showing a luminance ratio versus a difference between a highest point and a lowest point of an upper surface of a pixel electrode in a certain pixel of the display apparatus of FIG. 1.

When a largest distance from among distances between an upper surface (+z direction) of the substrate 100 and the plurality of peak points of the upper surface of the first color emission layer is referred to as a maximum distance and a smallest distance from among distances between the upper surface (+z direction) of the substrate 100 and the plurality of valley points of the upper surface of the first color emission layer is referred to as a minimum distance, a difference between the maximum distance and the minimum distance may be defined as a maximum-minimum difference in the first color emission layer. FIG. 2 is a graph using luminance data measured on a plurality of first pixels PX1, the graph showing a luminance ratio (relative luminance) versus the maximum-minimum difference. The unit of the horizontal axis is A.

As can be seen from FIG. 2, as the maximum-minimum difference varies, luminance of blue light beam varies. Accordingly, when maximum-minimum differences are not constant in a plurality of first color emission layers of the organic light-emitting display apparatus, even when the same electrical signal is applied to the plurality of first pixel electrodes 311, the luminance of blue light beams emitted by the plurality of first pixels PX1 may be different from one another. This finally leads to a deterioration of the quality of an image realized by the organic light-emitting display apparatus.

In the organic light-emitting display apparatus according to the present invention, a difference between a highest point, which is a peak point representing the above-described maximum distance from among the plurality of peak points of the upper surface of the first color emission layer, and a lowest point, which is a valley point representing the above-described minimum distance from among the plurality of valley points of the upper surface of the first color emission layer, namely, a maximum-minimum difference, is about 400 Å to about 900 Å. As can be seen from FIG. 2, when the maximum-minimum difference is rendered 400 Å to 900 Å, a relative luminance with respect to a maximum luminance value is maintained at 0.9 or greater. Thus, when the same electrical signal is applied to the plurality of first pixel electrodes 311, the luminance of the blue light beams emitted by the plurality of first pixels PX1 may be rendered approximately uniform, thereby implementing an organic light-emitting display apparatus capable of displaying a high-quality image.

Likewise, although an upper surface (+z direction) of the second pixel electrode 312 is illustrated as flat in FIG. 1, the upper surface of the second pixel electrode 312 is not actually flat. Because the second pixel electrode 312 is not formed to have a uniform thickness, the upper surface of the second pixel electrode 312 may not be flat. Alternatively, because various wires are located under the second pixel electrode 312 even when the second pixel electrode 312 is formed to have a uniform thickness, the second pixel electrode 312 may be curved and, thus, the upper surface thereof may not be flat. The second color emission layer disposed over the second pixel electrode 312 may also have a non-flat upper surface. Accordingly, there may be a plurality of peak points and a plurality of valley points on the upper surface of the second color emission layer disposed over the second pixel electrode 312.

Figure 3:
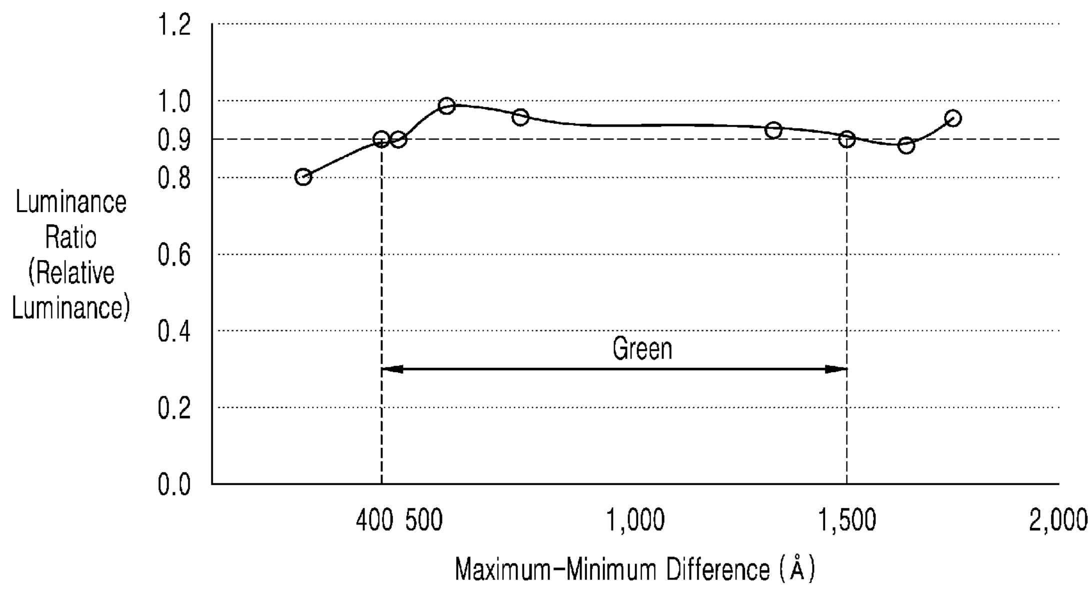
FIG. 3 is a graph showing a luminance ratio versus a difference between a highest point and a lowest point of an upper surface of a pixel electrode in another pixel of the display apparatus of FIG. 1.

When a largest distance from among distances between an upper surface (+z direction) of the substrate 100 and a plurality of peak points of the upper surface of the second color emission layer is referred to as a maximum distance and a smallest distance from among distances between the upper surface (+z direction) of the substrate 100 and the plurality of valley points of the upper surface of the second color emission layer is referred to as a minimum distance, a difference between the maximum distance and the minimum distance may be defined as a maximum-minimum difference in the second color emission layer. FIG. 3 is a graph using luminance data measured on a plurality of second pixels PX2, the graph showing a luminance ratio (relative luminance) versus the maximum-minimum difference. The unit of the horizontal axis is A.

As can be seen from FIG. 3, as the maximum-minimum difference varies, luminance of green light beam varies. Accordingly, when maximum-minimum differences are not constant in a plurality of second color emission layers of the organic light-emitting display apparatus, even when the same electrical signal is applied to the plurality of second pixel electrodes 312, the luminance of green light beams emitted by the plurality of second pixels PX2 may be different from one another. This finally leads to a deterioration of the quality of an image realized by the organic light-emitting display apparatus.

In the organic light-emitting display apparatus according to the present embodiment, a difference between a highest point, which is a peak point indicating the above-described maximum distance from among the plurality of peak points of the upper surface of the second color emission layer, and a lowest point, which is a valley point indicating the above-described minimum distance from among the plurality of valley points of the upper surface of the second color emission layer, namely, a maximum-minimum difference, is about 400 Å to about 1,500 Å. As can be seen from FIG. 3, when the maximum-minimum difference is rendered 400 Å to 1500 Å, a relative luminance with respect to a maximum luminance value is maintained at 0.9 or greater. Thus, when the same electrical signal is applied to the plurality of second pixel electrodes 312, the luminance of the green light beams emitted by the plurality of second pixels PX2 may be rendered approximately uniform, thereby implementing an organic light-emitting display apparatus capable of displaying a high-quality image.

Likewise, although an upper surface (+z direction) of the third pixel electrode 313 illustrated as flat in FIG. 1, the upper surface of the third pixel electrode 313 is not actually flat. Because the third pixel electrode 313 is not formed to have a uniform thickness, the upper surface of the third pixel electrode 313 may not be flat. Alternatively, because various wires are located under the third pixel electrode 313 even when the third pixel electrode 313 is formed to have a uniform thickness, the third pixel electrode 313 may be curved and, thus, the upper surface thereof may not be flat. The third color emission layer disposed over the third pixel electrode 313 may also have a non-flat upper surface. Accordingly, there may be a plurality of peak points and a plurality of valley points on the upper surface of the third color emission layer.

Figure 4:
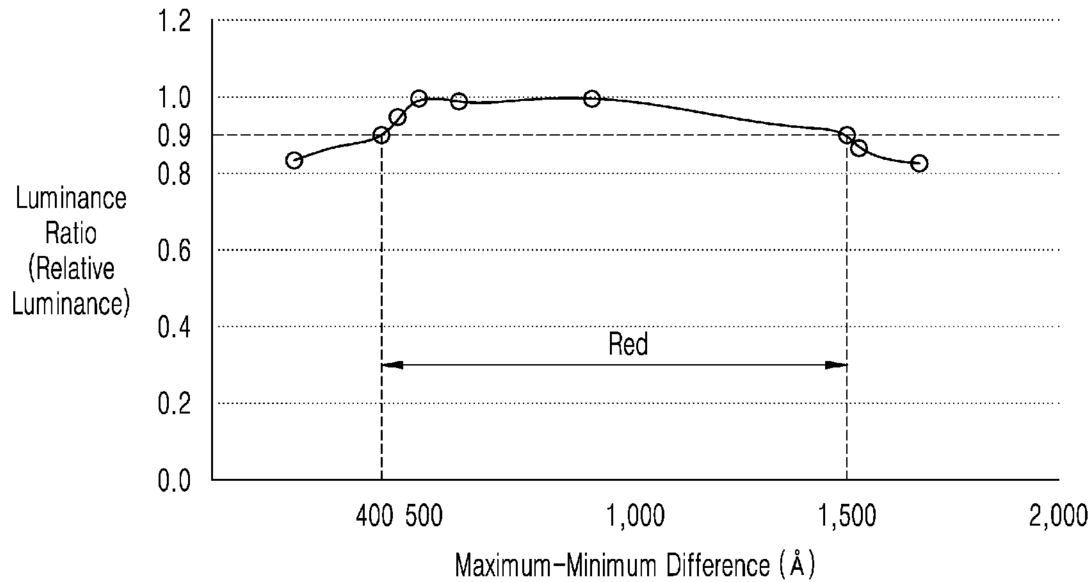
FIG. 4 is a graph showing a luminance ratio versus a difference between a highest point and a lowest point of an upper surface of a pixel electrode in another pixel of the display apparatus of FIG. 1.

When a largest distance from among distances between an upper surface (+z direction) of the substrate 100 and a plurality of peak points of the upper surface of the third color emission layer is referred to as a maximum distance and a smallest distance from among distances between the upper surface (+z direction) of the substrate 100 and the plurality of valley points of the upper surface of the third color emission layer is referred to as a minimum distance, a difference between the maximum distance and the minimum distance may be defined as a maximum-minimum difference in the third color emission layer. FIG. 4 is a graph using luminance data measured on a plurality of third pixels PX3, the graph showing a luminance ratio (relative luminance) versus the maximum-minimum difference. The unit of the horizontal axis is Å.

As can be seen from FIG. 4, as the maximum-minimum difference varies, luminance of red light beam varies. Accordingly, when maximum-minimum differences are not constant in a plurality of third color emission layers of the organic light-emitting display apparatus, even when the same electrical signal is applied to the plurality of third pixel electrodes 313, the luminance of red light beams emitted by the plurality of third pixels PX3 may be different from one another. This finally leads to a deterioration of the quality of an image realized by the organic light-emitting display apparatus.

In the organic light-emitting display apparatus according to the present embodiment, a difference between a highest point, which is a peak point indicating the above-described maximum distance from among the plurality of peak points of the upper surface of the third color emission layer, and a lowest point, which is a valley point indicating the above-described minimum distance from among the plurality of valley points of the upper surface of the third color emission layer, namely, a maximum-minimum difference, is about 400 Å to about 1,500 Å. As can be seen from FIG. 4, when the maximum-minimum difference is rendered 400 Å to 1500 Å, a relative luminance with respect to a maximum luminance value is maintained at 0.9 or greater. Thus, when the same electrical signal is applied to the plurality of third pixel electrodes 313, the luminance of the red light beams emitted by the plurality of third pixels PX3 may be rendered approximately uniform, thereby implementing an organic light-emitting display apparatus capable of displaying a high-quality image.

Figure 5:
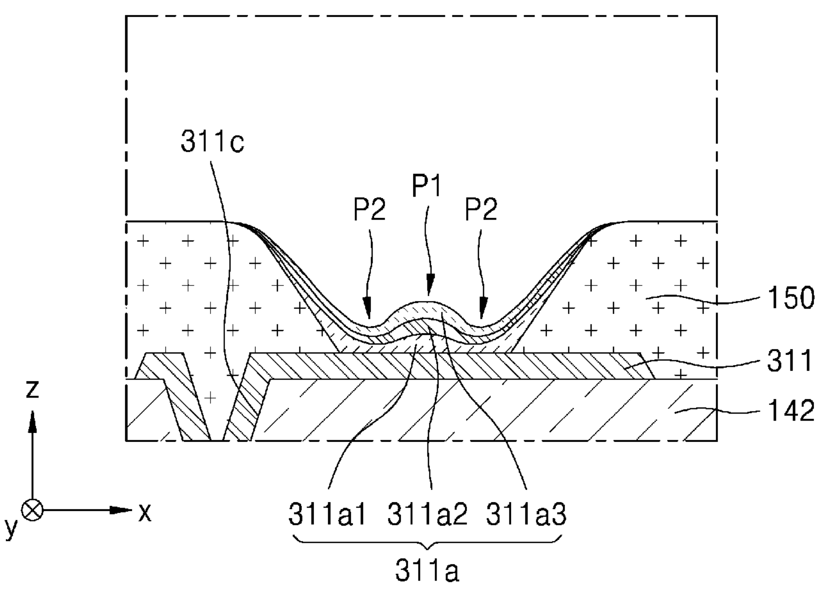
FIG. 5 is a schematic cross-sectional view of a portion of a certain pixel of the display apparatus of FIG. 1.

FIG. 5 is a schematic cross-sectional view of a portion of a first pixel PX1 of the display apparatus of FIG. 1. Referring to FIG. 5, a hole injection layer 311*a*1, a hole transport layer 311*a*2, and a first color emission layer 311*a*3 are disposed over the first pixel electrode 311.

As described above, the first color emission layer is formed by inkjet printing. For example, the first color emission layer is formed by dropping a material on the upper surface of the first pixel electrode 311 exposed by the pixel defining layer 150 via inkjet printing and drying and/or curing the material. The material dropped on the upper surface of the first pixel electrode 311 exposed by the pixel defining layer 150 via inkjet printing is initially in a fluid state, but is dried and/or cured over time. Accordingly, layers formed on the first pixel electrode 311 by inkjet printing may have shapes as shown in FIG. 5, because a material having fluidity gathers toward the center of the first pixel electrode 311 during the drying process. For reference, the hole injection layer 311*al* is dried and/or cured and then the hole transport layer 311*a*2 is formed, and the hole transport layer 311*a*2 is dried and/or cured and then the first color emission layer 311*a*3 is formed.

Figure 6:
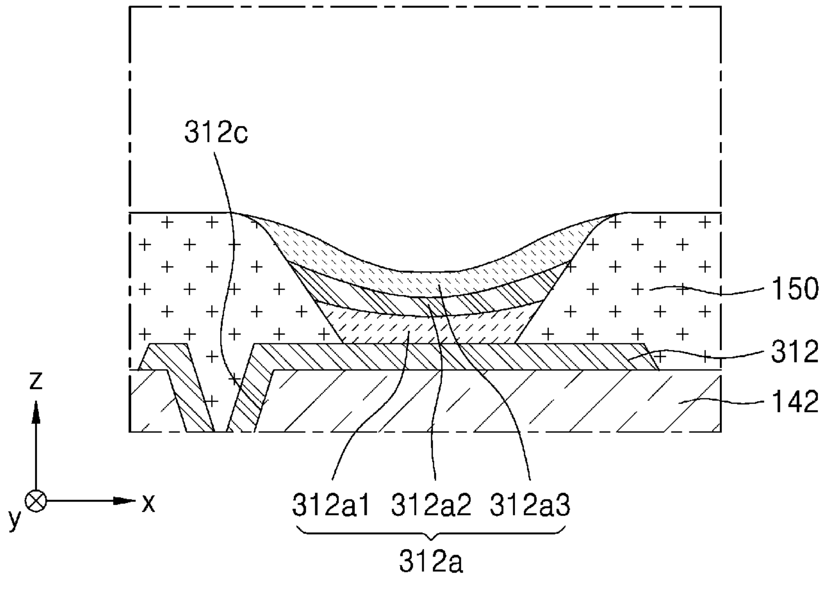
FIG. 6 is a schematic cross-sectional view of a portion of another pixel of the display apparatus of FIG. 1.

FIG. 6 is a schematic cross-sectional view of a portion of a second pixel PX2 of the display apparatus of FIG. 1. Referring to FIG. 6, a hole injection layer 312*al*, a hole transport layer 312*a*2, and a second color emission layer 312*a*3 are disposed over the second pixel electrode 312.

As described above, the second color emission layer is formed by inkjet printing. For example, the second color emission layer is formed by dropping a material on the upper surface of the second pixel electrode 312 exposed by the pixel defining layer 150 via inkjet printing and drying and/or curing the material. The material dropped on the upper surface of the second pixel electrode 312 exposed by the pixel defining layer 150 via inkjet printing is initially in a fluid state but is dried and/or cured over time. Accordingly, layers formed on the second pixel electrode 312 by inkjet printing may have shapes as shown in FIG. 6. For reference, the hole injection layer 312*al* is dried and/or cured and then the hole transport layer 312*a*2 is formed, and the hole transport layer 312*a*2 is dried and/or cured and then the second color emission layer 312*a*3 is formed.

Shapes of the hole injection layer 312*al*, the hole transport layer 312*a*2, and the second color emission layer 312*a*3 in the second pixel PX2 are different from those of the hole injection layer 311*al*, the hole transport layer 311*a*2, and the first color emission layer 311*a*3 in the first pixel PX1, because thicknesses of the hole injection layer 312*al*, the hole transport layer 312*a*2, and the second color emission layer 312*a*3 are different from those of the hole injection layer 311*al*, the hole transport layer 311*a*2, and the first color emission layer 311*a*3.

When each layer has a small thickness, a material having fluidity gathers toward the center during drying as described above with reference to FIG. 5 and, thus, the center portion of each layer has a convex shape, as shown in FIG. 5. In other words, the first color emission layer 311*a*3 has a portion P2 having a thickness less than a thickness of a portion P1 of the first color emission layer 311*a*3 at a center of a portion of the first pixel electrode 311 exposed by the pixel defining layer 150. However, when each layer is sufficiently thick, as in the second pixel PX2, a material does not gather toward the center during drying, and is entirely uniformly dried. In this case, because an edge of each layer is dried while approximately covering an inner side surface of the pixel defining layer 150 in a central direction of the second pixel electrode 312 due to a surface tension or the like as shown in FIG. 6, a thickness of the second color emission layer 312*a*3 is smallest at a portion corresponding to the center of a portion of the second pixel electrode 312 exposed by the pixel defining layer 150. As a result, the second color emission layer 312*a*3 may have a "U" shape on a cross-sectional view as shown in FIG. 6.

Figure 7:
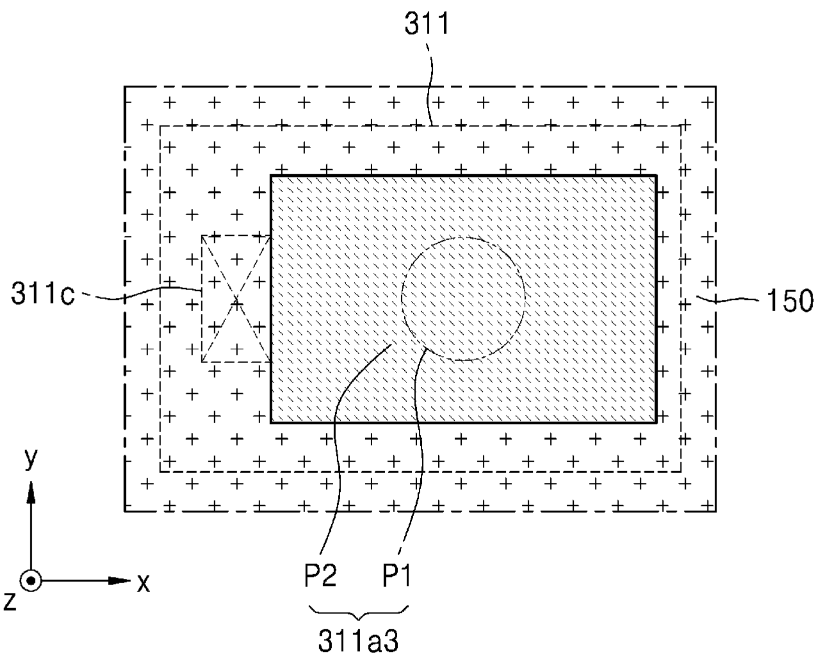
FIG. 7 is a schematic plan view of a portion of a certain pixel of the display apparatus of FIG. 1.

FIG. 7 is a schematic plan view of a portion of the first pixel PX1 of the display apparatus of FIG. 1. As described above, the first color emission layer 311*a*3 has a portion P2 having a thickness less than a thickness of a portion P1 of the first color emission layer 311*a*3 at a center of a portion of the first pixel electrode 311 exposed by the pixel defining layer 150. Accordingly, the portion P2 of the first color emission layer 311*a*3 having a thickness less than a thickness of the portion P1 of the first color emission layer 311*a*3 at the center of the portion of the first pixel electrode 311 exposed by the pixel defining layer 150 may surround the portion P1 of the first color emission layer 311*a*3 at the center of the portion of the first pixel electrode 311 exposed by the pixel defining layer 150. Also in this case, an edge of each layer may entirely cover an inner side surface of the pixel defining layer 150 in a central direction of the first pixel electrode 311 due to a surface tension or the like as shown in FIG. 5. Accordingly, a distance from the substrate 100 to an end of the edge of the first color emission layer 311*a*3 may be greater than a distance from the substrate 100 to the portion P1 of the first color emission layer 311*a*3 at the center of the portion of the first pixel electrode 311 exposed by the pixel defining layer 150. As a result, the first color emission layer 311*a*3 may have a "W" shape on a cross-sectional view as shown in FIG. 5.

For reference, because the first color emission layer 311*a*3 covers the inner side surface of the pixel defining layer 150, FIG. 7 shows that the first color emission layer 311*a*3 is wider than a portion of the first pixel electrode 311 not covered by the pixel defining layer 150.

Figure 8:
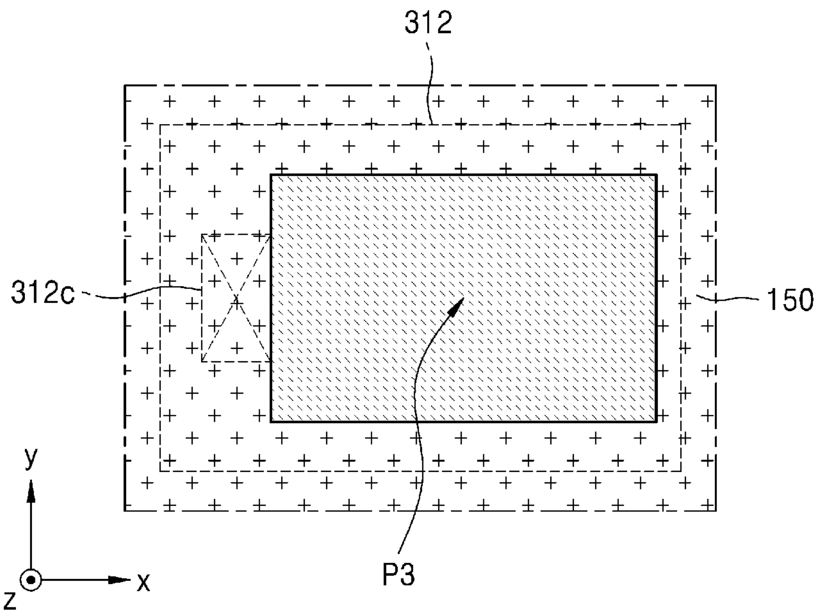
FIG. 8 is a schematic plan view of a portion of another pixel of the display apparatus of FIG. 1.

FIG. 8 is a schematic cross-sectional view of a portion of a second pixel PX2 of the display apparatus of FIG. 1. The second color emission layer 312*a*3 is thinnest at a portion P3 corresponding to the center of the portion of the second pixel electrode 312 not covered by the pixel defining layer 150 and, thus, has a different shape from the shape of the first color emission layer 311*a*3.

The first color emission layer 311*a*3 is thin and, thus, has a "W" shape on a cross-sectional view, and accordingly, is greatly affected by the above-described maximum-minimum difference on the upper surface of the first pixel electrode 311. The second color emission layer **312*a*3 is thick and, thus, has a "U" shape in a cross-sectional view, and accordingly, is relatively less affected by the above-described maximum-minimum difference on the upper surface of the second pixel electrode 312 than the first color emission layer 311*a*3 is. Consequently, the maximum-minimum difference in the first pixel electrode 311 may be about 400 Å to about 900 Å, and the maximum-minimum difference in the second pixel electrode 312** may be about 400 Å to about 1,500 Å, which is a wider range than the range of about 400 Å to about 900 Å.

The description of the second pixel PX2, the second pixel electrode 312, and the second color emission layer **312*a*3 each emitting green light is equally applicable to the third pixel PX3, the third pixel electrode 313**, and the third color emission layer each emitting red light.

As described above, according to the inventive concepts, a display apparatus capable of displaying a high-quality image, and a method of manufacturing the same may be provided. Of course, the scope of the disclosure is not limited thereto.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An organic light-emitting display apparatus comprising:

a substrate;

a first pixel electrode over the substrate, the first pixel electrode comprising an upper surface;

a pixel defining layer covering an edge of the first pixel electrode, the pixel defining layer comprising a first opening exposing a portion of the first pixel electrode, the upper surface of the first pixel electrode being substantially planar throughout the first opening; and a first color emission layer disposed over the first pixel electrode and having an upper surface on which a distance in a direction perpendicular to a surface of the substrate between a highest point and a lowest point is about 400 Å to about 900 Å, wherein the lowest point on the upper surface of the first color emission layer overlaps the first opening, a distance from the substrate to the upper surface of the first color emission layer at a central portion of the first color emission layer is greater than a distance from the substrate to the upper surface of the first color emission layer at the lowest point of the first color emission layer, the first color emission layer comprises a valley, a distance from the substrate to the upper surface of the first color emission layer at the valley is less than the distance from the substrate to the upper surface of the first color emission layer at the central portion, and, in a plan view, the valley encloses the central portion of the first color emission layer.

2. The organic light-emitting display apparatus of claim 1, wherein a wavelength of light emitted by the first color emission layer belongs to a wavelength band of about 450 nm to about 495 nm.

3. The organic light-emitting display apparatus of claim 1, further comprising:

a second pixel electrode disposed over the substrate and apart from the first pixel electrode; and a second color emission layer disposed over the second pixel electrode, wherein the pixel defining layer covers an edge of the second pixel electrode and comprises a second opening that exposes a portion of the second pixel electrode, and the second color emission layer has an upper surface on which a distance in the direction perpendicular to the surface of the substrate between a highest point and a lowest point at locations overlapping the second opening in the plan view is in a range of about 400 Å to about 1,500 Å.

4. The organic light-emitting display apparatus of claim 3, wherein a wavelength of light emitted by the second color emission layer belongs to a wavelength band of about 495 nm to about 570 nm.

5. The organic light-emitting display apparatus of claim 3, further comprising:

a third pixel electrode disposed over the substrate and apart from the first pixel electrode and the second pixel electrode; and a third color emission layer disposed over the third pixel electrode, wherein the pixel defining layer covers an edge of the third pixel electrode and comprises a third opening that exposes a portion of the third pixel electrode, and the third color emission layer has an upper surface on which a distance in the direction perpendicular to the surface of the substrate between a highest point and a lowest point at locations overlapping the third opening in the plan view is in a range of about 400 Å to about 1,500 Å.

6. The organic light-emitting display apparatus of claim 5, wherein a wavelength of light emitted by the third color emission layer belongs to a wavelength band of about 630 nm to about 750 nm.

7. The organic light-emitting display apparatus of claim 3, wherein a thickness of the second color emission layer is smallest at a center of the second opening; and the thickness at the center of the second opening is smaller than a thickness of the second color emission layer at an edge of the second opening.

8. The organic light-emitting display apparatus of claim 7, wherein the second color emission layer covers an inner side surface of the second opening.

9. The organic light-emitting display apparatus of claim 1, wherein the first color emission layer covers an inner side surface of the first opening, and a thickness of the first color emission layer has a "W" shape in a cross-sectional view.

10. The organic light-emitting display apparatus of claim 9, wherein a distance from the substrate to an end of the edge of the first color emission layer is greater than the distance from the substrate to the upper surface of the first color emission layer at the central portion of the first color emission layer.

* * * * *